United States Patent [19]

Nagata

[11] Patent Number: 4,701,719
[45] Date of Patent: Oct. 20, 1987

[54] DIFFERENTIAL AMPLIFICATION CIRCUIT

[75] Inventor: Minoru Nagata, Yokohama, Japan

[73] Assignee: Kabushiki Kaisha Toshiba, Kawasaki, Japan

[21] Appl. No.: 883,724

[22] Filed: Jul. 9, 1986

[30] Foreign Application Priority Data

Jul. 11, 1985 [JP] Japan .............................. 60-104863[U]

[51] Int. Cl.$^4$ ............................................... H03F 3/45
[52] U.S. Cl. ...................................... 330/258; 330/257
[58] Field of Search ............... 330/252, 257, 258, 259, 330/260, 261, 294, 107

[56] References Cited

FOREIGN PATENT DOCUMENTS 2135548  8/1984  United Kingdom ................ 330/258

Primary Examiner—Gene Wan
Attorney, Agent, or Firm—Cushman, Darby & Cushman

[57] ABSTRACT

A first differential amplifier amplifies the differential signal component of the input signal supplied to input terminals. The differential component is then supplied to output terminals. The first differential amplifier comprises a first differential pair of transistors for producing a differential output current proportional to the input signal, and two load impedance elements connected to the outputs of the transistors of the first differential pair, for converting the output current to a voltage output. A current source is coupled to both load impedance elements. The in-phase component provided at the output terminals is detected by a detector circuit. A second differential amplifier detects the difference between the in-phase component and a reference value. This difference changes the output current of the current source, thereby controlling the in-phase component.

11 Claims, 3 Drawing Figures

DIFFERENTIAL AMPLIFICATION CIRCUIT

BACKGROUND OF THE INVENTION

This invention relates to a differential amplification circuit, and more particularly to the differential amplification circuit able to generate an output having a controlled in-phase component.

It is often required that the DC level of the output of a differential amplification circuit designed to output a voltage be precisely controlled. To meet this requirement, the difference between the in-phase component of the output voltage and a reference value is negatively fed back to the circuit.

More specifically, a differential signal input to the input terminals of the differential amplification circuit is amplified by a differential amplifier making a part of the circuit, and is output from the output terminals of the circuit. The in-phase component of the amplified signal is detected at the output terminals of the circuit. The in-phase component is input to the inverting input terminal of an operational amplifier. The reference value is input to the noninverting input terminal of the operational amplifier. Hence, the operational amplifier outputs the difference between the in-phase component and the reference value. This difference is negatively fed back to the differential amplifier, thereby controlling the DC level of the output voltage.

The operational amplifier must be a large-scale one, however. The amplification circuit is inevitably large and can hardly be made in the form of an integrated circuit.

SUMMARY OF THE INVENTION

Accordingly, the object of the present invention is to provide a differential amplification circuit which can output a voltage having a precisely controlled in-phase component, and which can be small and can be made in the form of an integrated circuit.

The invention is based on the fact that a differential amplifier can be used as part of an operational amplifier. According to the invention, a differential amplifier is used in place of an operational amplifier. A differential amplification circuit according to this invention comprises a first differential amplifier for amplifying the differential component of an input signal, a current source coupled to the first differential amplifier, a detection circuit for detecting the in-phase component of an output signal of the first differential amplifier, and a second differential amplifier for detecting the difference between the in-phase component detected by the detection circuit and a reference value and for varying the current supplied from the current source, in accordance with the detected difference, thereby to control the in-phase components.

DETAILED DESCRIPTION OF THE PREFERRED EMBODIMENTS

The preferred embodiments of the invention will now be described in detail with reference to FIGS. 1 to 3 attached hereto.

Figure 1:
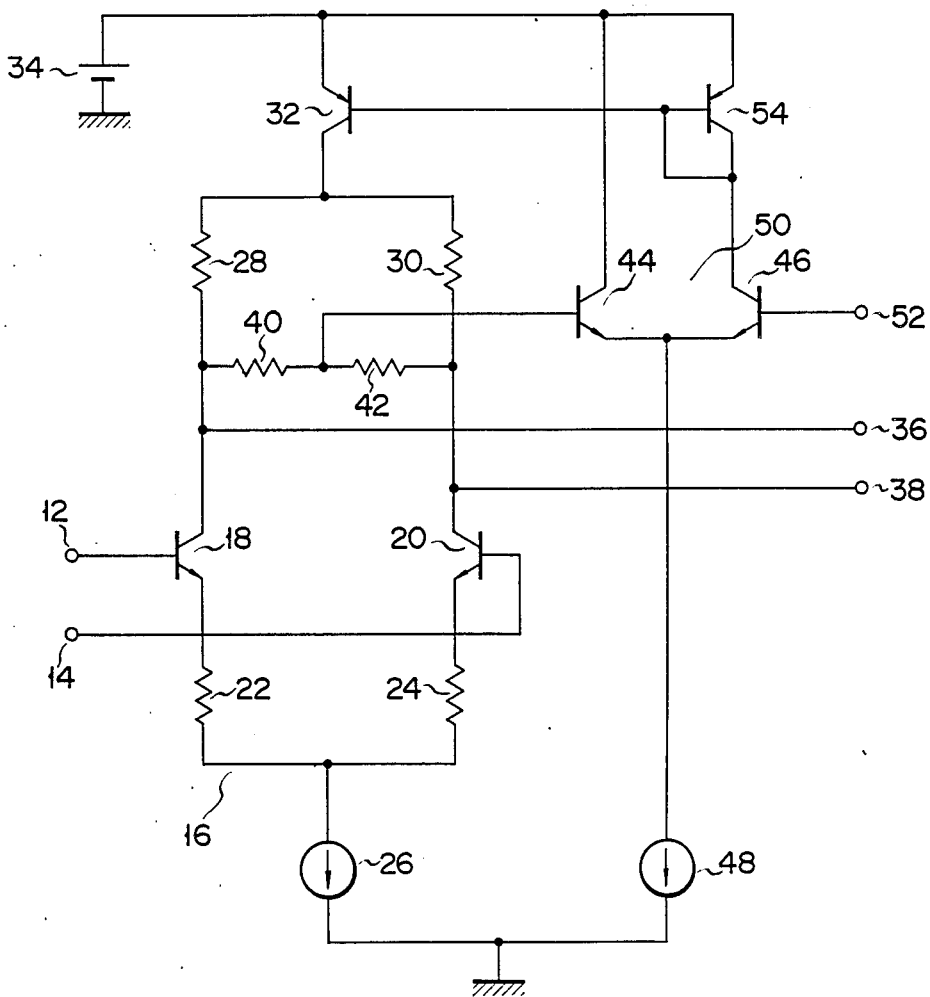
FIG. 1 is a circuit diagram of the first embodiment of the present invention.

As shown in FIG. 1, the first embodiment comprises first differential amplifier 16 and second differential amplifier 50. First amplifier 16 comprises a first differntial pair of NPN transistors 18 and 20. The bases of transistors 18 and 20 are connected to input terminals 12 and 14, respectively. The emitter of transistor 18 is connected to resistor 22 coupled to constant current source 26. The emitter of transistor 20 is coupled to resistor 24 connected to current source 26. The collector of transistor 18 is connected to resistor 28 coupled to the collector of PNP transistor 32. The collector of transistor 20 is connected to resistor 30 coupled to the collector of PNP transistor 32. The emitter of transistor 32 is coupled to a power source 34. The collectors of transistors 18 and 20 are also connected to output terminals 36 and 38.

Two resistors 40 and 42 are connected in series between output terminals 36 and 38. The in-phase component of the input signal supplied to input terminals 12 and 14 is supplied to second differential amplifier 50 comprised of second differential pair of NPN transistors 44 and 46, and constant current source 48. The connection point between resistors 40 and 42 is coupled to the base of transistor 44. The base of transistor 46 is coupled to reference input terminal 52. The emitters of transistors 44 and 46 are connected to constant current source 48. The collector of transistor 46 is coupled to the base-collector path of PNP transistor 54. Transistor 54 is diode-connected. In other words, its emitter is coupled to power source 34, and its base and collector are connected. The base and collector of transistor 54 are also connected to the base of transistor 32. Hence, transistors 32 and 54 form a current mirror circuit wherein the emitter-collector current of transistor 54 has a predetermined ratio to that of transistor 32.

Transistors 18 and 20, resistors 22 and 24, and current source 26 form a current output circuit for producing a differential current output proportional to the input voltage. Resistors 28 and 30 function as load impedance elements, and transistor 32 operates as a current source. Second differential amplifier 50 detects the difference between the in-phase component detected by resistors 40 and 42 and the reference value input to reference input terminal 52. This difference is input to transistor 54, thereby controlling transistor 32.

Constant current source 26 exhibits a high impedance to the in-phase component. Therefore, when the collector current of transistor 32, which functions as a current source, changes, the collector voltages of transistors 18 and 20 change greatly. Thus, a highgain amplification is accomplished. Hence, the first and second differential amplifiers cooperate to perform the function of an operational amplifier, whereby the DC level of the differential output can be controlled.

Figure 2:
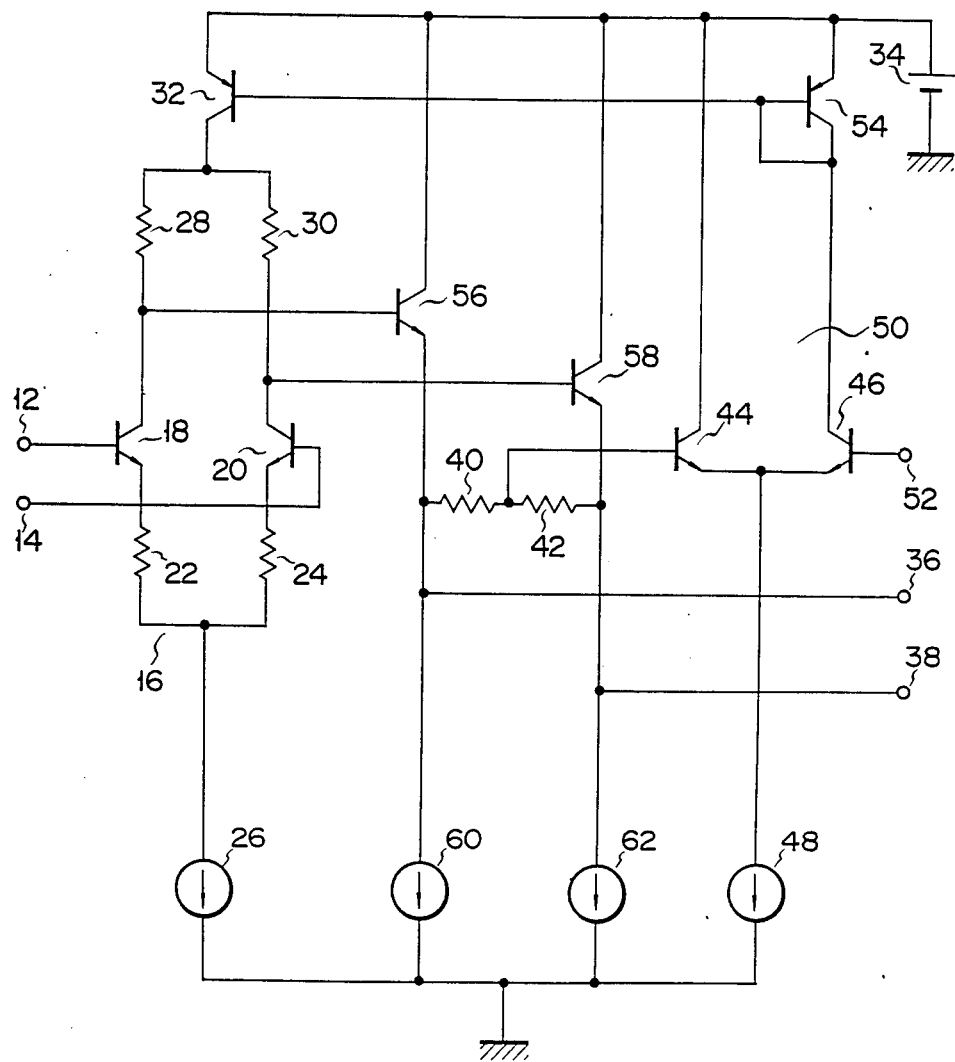
FIG. 2 is a circuit diagram of the second embodiment of the invention.

FIG. 2 shows the second embodiment of the present invention. This embodiment is characterized in that a differential output is supplied through transistors 56 and 58 which form an emitter follower. As shown in FIG. 2, the collector of transistor 18 is connected to the base of transistor 56 whose collector is coupled to power source 34. The emitter of transistor 56 is connected to constant current source 60 and also to output terminal 36. The collector of transistor 20 is coupled to the base of transistor 58 whose collector is coupled to power source 34. The emitter of transistor 58 is connected to constant current source 62 and also to output terminal 38. Since the differential output is obtained through transistors 56 and 58 forming an emitter follower, the impedance across output terminals 36 and 38 is relatively low. Thus, even if a circuit having a low input-impedance is connected to output terminals 36 and 38, the difference between the output and a desired (or reference) value can be small.

Figure 3:
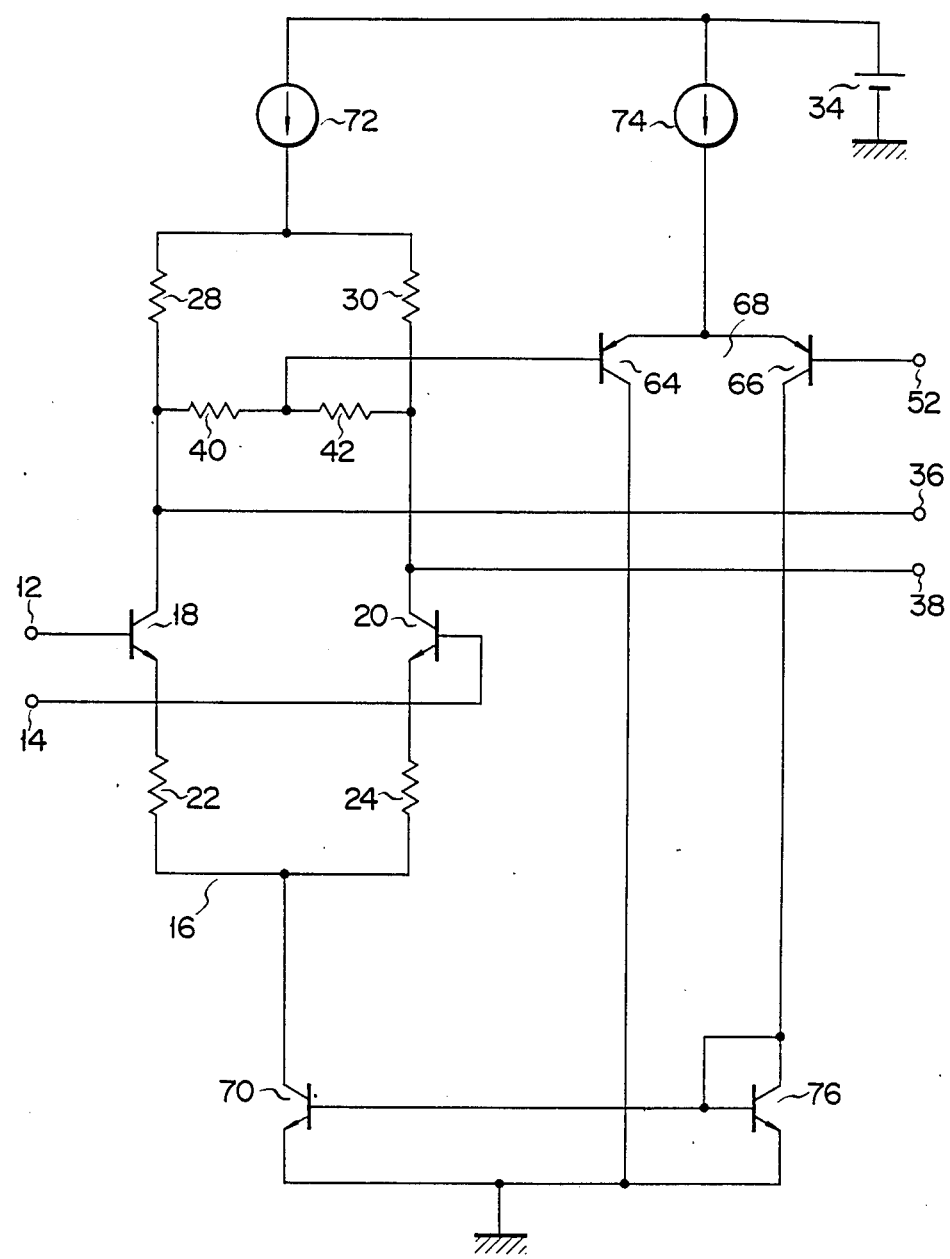
FIG. 3 is a circuit diagram of the third embodiment of the invention.

FIG. 3 shows the third embodiment of the present invention. In this embodiment, PNP transistors 64 and 66 are used in place of NPN transistors 44 and 46 used in the first and second embodiments. Transistors 64 and 66 form a second differential amplifier 68. The connection point between resistors 22 and 24 is coupled to the collector of NPN transistor 70 whose emitter is connected to the ground. The connection point between resistors 28 and 30 is coupled to constant current source 72. The connection point between resistors 40 and 42 is coupled to the base of transistor 64 whose emitter is coupled to constant current source 74. The emitter of transistor 64 is also coupled to the emitter of transistor 66 whose base is connected to reference terminal 52. The collector of transistor 66 is coupled to the base-collector path of NPN transistor 76. Transistor 76 is diode-coupled. In other words, the emitter of transistor 76 is coupled to the ground, and the base and collector of transistor 76 are connected to each other. The base-collector path of transistor 76 is also connected to the base of transistor 70. Transistors 70 and 76 form a current mirror circuit wherein the collector-emitter current of transistor 76 has a predetermined ratio to that of transistor 70.

Transistors 18 and 20, resistors 22 and 24 and transistor 70, which functions as a current source, form a current output circuit for producing a differential current output proportional to the input voltage. Resistors 28 and 30 function as load impedance elements.

Constant current source 72 exhibits a high impedance to the in-phase component. Therefore, when the collector current of transistor 70, which functions as a current source, changes, the collector voltages of transistors 18 and 20 change greatly. Thus, a highgain amplification is accomplished. Hence, the first and second differential amplifiers cooperate to perform the function of an operational amplifier, whereby the DC level of the differential output can be controlled.

In the third embodiment, the in-phase component of the output signal, which has been detected by resistors 40 and 42, is input to the base of transistor 64, which acts as an inverting input terminal for the in-phase component. Therefore, the in-phase component can be adjusted as close as possible to the reference value, without using an operational amplifier.

What is claimed is:

1. A differential amplification circuit able to generate an output having a controlled in-phase component, said circuit comprising:
    a first differential amplifier for amplifying the differential component of an input signal;
    a current source coupled to the first differential amplifier;
    a detection circuit for detecting the in-phase component of an output signal of the first differential amplifier; and;
    a second differential amplifier for detecting the difference between the in-phase component detected by the detection circuit and a reference value and for varying the current supplied from the current source, in accordance with the detected difference, thereby to control the in-phase component.

2. The differential amplification circuit according to claim 1, wherein said first differential amplifier comprises a first differential pair of transistors for generating a differential current output corresponding to the input signal, and first and second load impedance elements connected to the outputs of the transistors of the first differential pair, for converting the differential current output to a voltage output, and said current source is connected to the first and second load impedance elements.

3. The differential amplification circuit according to claim 2, wherein said second differential amplifier has a second differential pair of transistors both being of NPN type, the base of one of said NPN transistors being connected to receive the in-phase component, and the base of the other NPN transistor being connected to receive the reference value, whereby said second differential amplifier produces an output corresponding to the difference between the in-phase component and the reference value.

4. The differential amplification circuit according to claim 3, wherein said detection circuit includes two resistors connected in series between the collectors of the transistors of the first differential pair, the connection point between the resistors being connected to the base of one of the NPN transistors of the second differential pair.

5. The differential amplification circuit according to claim 4, wherein said current source includes a transistor having an emitter connected to a power source, a collector connected to the first and second load impedance elements, and a base connected to the output of said other NPN transistor of the second differential pair.

6. The differential amplification circuit according to claim 5, wherein the base of the transistor of said current source is connected to the base of a diode-connected transistor whose emitter is connected to said power source, whose collector is connected to the collector of said other NPN transistor of the second differential pair, and whose base and collector are connected, the transistor of the current source and the diode-connected transistor forming a current mirror circuit wherein the emitter-collector current of the transistor of the current source has a predetermined ratio to the collector current of said other NPN transistor of the second diferential pair.

7. The differential amplification circuit according to claim 6, wherein the outputs of the transistors of the first differential pair are output through an emitter follower circuit.

8. The differential amplification circuit according to claim 2, wherein said second differential amplifier has a second differential pair of transistors both being of PNP type, the base of one of said PNP transistors being connected to receive the in-phase component, and the base of the other PNP transistor being connected to receive the reference value, whereby said second differential amplifier produces an output corresponding to the difference between the in-phase component and the reference value.

9. The differential amplification circuit according to claim 8, wherein said detection circuit includes two resistors connected in series between the collectors of the transistors of the first differential pair, the connection point between the resistors being connected to the base of one of the PNP transistors of the second differential pair.

10. The differential amplification circuit according to claim 9, wherein said current source includes a transistor having a grounded emitter, a collector connected to the emitters of the transistors of the first differential pair, and a base connected to the output of said other PNP transistor of the second differential pair.

11. The differential amplification circuit according to claim 10, wherein the base of the transistor of said current source is connected to the base of a diode-connected transistor whose emitter is grounded, whose collector is connected to the collector of said other PNP transistor of the second differential pair, and whose base and collector are connected, the transistor of the current source and the diode-connected transistor forming a current mirror circuit wherein the collector-emitter current of the transistor of the current source has a predetermined ratio to the collector current of said other PNP transistor of the second differential pair.

* * * * *